(12) United States Patent
Park et al.

(10) Patent No.: US 8,759,133 B2
(45) Date of Patent: Jun. 24, 2014

(54) BACK PANEL FOR FLAT PANEL DISPLAY APPARATUS, FLAT PANEL DISPLAY APPARATUS COMPRISING THE SAME, AND METHOD OF MANUFACTURING THE BACK PANEL

(71) Applicant: Samsung Display Co., Ltd., Yongin (KR)

(72) Inventors: Sang-Ii Park, Yongin (KR); Chaun-Gi Choi, Yongin (KR); Tae-Kyung Ahn, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/054,085

(22) Filed: Oct. 15, 2013

(65) Prior Publication Data
US 2014/0038332 A1 Feb. 6, 2014

Related U.S. Application Data

(62) Division of application No. 13/443,457, filed on Apr. 10, 2012, now Pat. No. 8,575,606.

(30) Foreign Application Priority Data

May 26, 2011 (KR) ......................... 10-2011-0050187

(51) Int. Cl.
*H01L 21/00* (2006.01)
(52) U.S. Cl.
USPC .......................... 438/34; 257/34; 257/E51.018

(58) Field of Classification Search
USPC .................. 438/34, 28; 257/43, 40, E51.018
See application file for complete search history.

(56) References Cited

U.S. PATENT DOCUMENTS 8,502,221 B2 * 8/2013 Yamazaki ........................ 257/43
2011/0127579 A1 * 6/2011 Yamazaki ..................... 257/192

FOREIGN PATENT DOCUMENTS

KR      10-2004-0037889         5/2004

OTHER PUBLICATIONS

Notice of Allowance dated Jul. 2, 2013 in U.S. Appl. No. 13/443,457.

* cited by examiner

*Primary Examiner* — Chuong A Luu
*Assistant Examiner* — Nga Doan
(74) *Attorney, Agent, or Firm* — H.C. Park & Associates, PLC

(57) ABSTRACT

A back panel for a flat panel display apparatus includes: a pixel electrode disposed on a substrate; a first gate electrode layer of a thin-film transistor (TFT) disposed on the substrate; a second gate electrode layer disposed on the first gate electrode layer and including a semiconductor material; a third gate electrode layer disposed on the second gate electrode layer and including a metal material; a first insulating layer disposed on the third gate electrode layer; an active layer disposed on the first insulating layer and including a transparent conductive oxide semiconductor; a second insulating layer disposed on the active layer; source and drain electrodes disposed connected to the active layer through the second insulating layer; and a third insulating layer covering the source and drain electrodes. The first gate electrode layer and the pixel electrode include a transparent conductive oxide.

6 Claims, 4 Drawing Sheets

BACK PANEL FOR FLAT PANEL DISPLAY APPARATUS, FLAT PANEL DISPLAY APPARATUS COMPRISING THE SAME, AND METHOD OF MANUFACTURING THE BACK PANEL

CROSS-REFERENCE TO RELATED PATENT APPLICATIONS

This application is a divisional of U.S. patent application Ser. No. 13/443,457, and claims priority from and the benefit of Korean Patent Application No. 10-2011-0050187, filed on May 26, 2011, which are hereby incorporated by reference for all purposes as if fully set forth herein.

BACKGROUND OF THE INVENTION

1. Field of the Invention

Exemplary embodiments of the present invention relate to a back panel for a flat panel display apparatus, a flat panel display apparatus including the same, and a method of manufacturing the back panel.

2. Discussion of the Background

Flat panel display apparatuses, including organic light-emitting display apparatuses and liquid crystal display apparatuses, include active back panels that include thin-film transistors (TFTs) and capacitors formed in each pixel, to realize high resolution displays.

In particular, oxide semiconductor TFTs are regarded as optimum devices for use in back panels of flat panel display apparatuses, because they provide excellent electrical characteristics and can be processed at a low temperature. However, the process for manufacturing back panels that include the oxide semiconductor TFTs includes the use of a plurality of mask processes, thereby increasing manufacturing costs.

SUMMARY OF THE INVENTION

Exemplary embodiments of the present invention provide a back panel that can be manufactured in a simple process and has a high display quality, a flat panel display apparatus including the back panel, and a method of manufacturing the back panel.

Additional features of the invention will be set forth in the description which follows, and in part will be apparent from the description, or may be learned by practice of the invention.

Exemplary embodiments of the present invention provide a back panel for a flat panel display apparatus, the back panel including: a pixel electrode that is formed on a substrate and includes a transparent conductive oxide; a gate electrode including a first gate electrode layer of a thin-film transistor TFT that is formed on the same layer as the pixel electrode and is formed of the same material as the pixel electrode, a second gate electrode layer that is formed on the first gate electrode layer and includes a semiconductor material, and a third gate electrode layer that is formed on the second gate electrode layer and includes a metal material; a first insulating layer covering the third gate electrode layer; an active layer that is formed on the first insulating layer and includes a transparent conductive oxide; a second insulating layer covering the active layer; source and drain electrodes that are formed on the second insulating layer and are connected to the active layer through the second insulating layer; and a third insulating layer covering the source and drain electrodes.

Exemplary embodiments of the present invention provide a flat panel display apparatus including: a back panel for the flat panel display apparatus described above; a facing electrode that faces the pixel electrode; and a light-emitting layer formed between the pixel electrode and the facing electrode.

Exemplary embodiments of the present invention provide a method of manufacturing a back panel of a flat panel display apparatus, the method including: forming a first electrode material layer on a substrate, the first electrode material layer comprising a transparent conductive material layer, semiconductor material layer, and a metal layer; performing a first mask process on the first electrode material layer to form a pixel electrode and a gate electrode; forming a first insulating layer and a transparent conductive oxide layer, on the substrate; performing a second mask process on the transparent conductive oxide layer to form an active layer on the gate electrode; forming a second insulating layer on the substrate; performing a third mask process to forming a contact hole through the second insulating layer and a via-hole through the first and second insulating layers to expose a portion of the pixel electrode; forming a second electrode material layer on the substrate; performing a fourth mask process on the second electrode material layer to form source and drain electrodes that contact the active layer through the first holes, and to form openings in the first and second insulating layers that expose portions of the pixel electrode; forming a third insulating layer on the substrate; and performing a fifth mask process to form an opening to expose the first layer of the pixel electrode.

A back panel according to aspects of the present invention, a flat panel display apparatus including the back panel, and a method of manufacturing the back panel provide the following advantages.

First, the back panel can be manufactured using five mask processes.

Second, because a semiconductor layer as a protection layer is formed on a transparent pixel electrode, damage to the transparent pixel electrode during the manufacturing process can be prevented.

Third, the optical efficiency of a display apparatus can be increased, by forming the pixel electrode using a semi-transparent metal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
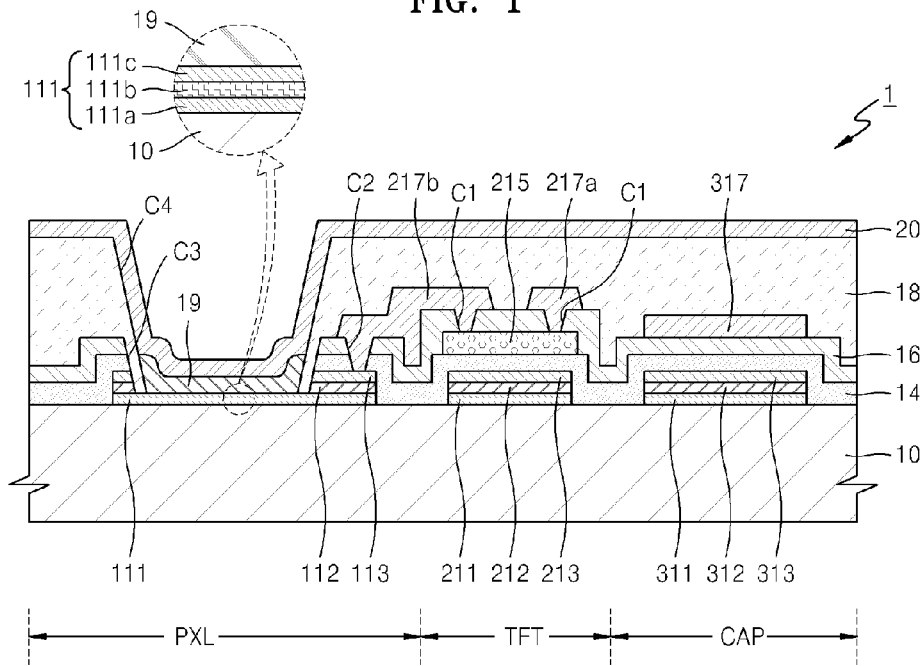
FIG. 1 is a schematic cross-sectional view of an organic light-emitting display apparatus, according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a schematic cross-sectional view of an organic light-emitting display apparatus 1, according to an exemplary embodiment of the present invention. FIGS. 2 through 8 are schematic cross-sectional views of a method of manufacturing the organic light-emitting display apparatus 1 of FIG. 1, according to an exemplary embodiment of the present invention.

Referring to FIG. 1, the organic light-emitting display apparatus 1 includes a substrate 10 having a pixel region PXL including a light-emitting layer 19, a thin-film transistor region TFT including a thin-film transistor, and a capacitor region CAP including a capacitor. In the pixel region PXL, a pixel electrode 111 that includes a transparent conductive material is formed on the substrate 10. The pixel electrode 111 may include a transparent conductive material, such as indium tin oxide (ITO), indium zinc oxide (IZO), zinc oxide (ZnO), indium oxide ($In_2O_3$), indium gallium oxide (IGO), or aluminum zinc oxide (AZO), or any combination thereof.

The pixel electrode 111 may be formed as a multiple layer structure that includes a semi-transparent metal layer 111b that includes silver (Ag). For example, as depicted in FIG. 1, the pixel electrode 111 may include a semi-transparent metal layer 111b, and transparent layers 111a and 111c that are formed on and under the semi-transparent metal layer 111b. The semi-transparent metal layer 111b may include Ag, and the transparent layers 111a and 111c may include a transparent conductive material, such as ITO. The semi-transparent metal layer 111b functions as a semi-transparent mirror and may form a resonance structure, together with a facing electrode 20. The resonance structure can increase the optical extraction efficiency of the organic light-emitting display apparatus 1.

A first protection layer 112 may be formed on an upper surface of the pixel electrode 111, for example, upper edges of the pixel electrode 111. The first protection layer 112 is a protective film for preventing the degradation of the pixel electrode 111 during a manufacturing process of the pixel electrode 111. In FIG. 1, the first protection layer 112 is disposed on upper edges of the pixel electrode 111. However, the present invention is not limited thereto. That is, the first protection layer 112 may be present only at an opening C2.

The first protection layer 112 may include a semiconductor material. The semiconductor material may be crystalline silicon or amorphous silicon that is highly doped. The semiconductor material may be an oxide that includes zinc (Zn), gallium (Ga), hafnium (Hf), indium (In), or tin (Sn), or any combination thereof.

A metal layer 113 including a low resistance metal material may be formed on the first protection layer 112. The metal layer 113 may include the same material used to form a third gate electrode 213 described below. For convenience, the pixel electrode 111, the metal layer 113, and the first protection layer 112, may be collectively referred to as a pixel electrode.

A first insulating layer 14 and a second insulating layer 16 are sequentially formed on edges of the pixel electrode 111. The pixel electrode 111 is exposed through an opening C3 formed in the first and second insulating layers 14 and 16. A third insulating layer 18 is formed on the second insulating layer 16. An opening C4 that exposes a portion of the pixel electrode 111 is formed in the third insulating layer 18.

The light-emitting layer 19 is formed on the exposed pixel electrode 111. Light generated by the light-emitting layer 119 may be emitted towards the substrate 10 and may pass through the transparent pixel electrode 111.

The light-emitting layer 19 may be formed of a low molecular weight organic material or a polymer organic material. If the light-emitting layer 19 is formed of a low molecular weight organic material, a hole transport layer (HTL), a hole injection Layer (HIL), an electron transport layer (ETL), and an electron injection layer (EIL) may be stacked around the light-emitting layer 19. The low molecular weight organic material may be various materials including copper phthalocyanine (CuPc), N,N'-di(naphthalene-1-yl)-N,N'-diphenyl-benzidine (NPB), or tris-8-hydroxyquinoline aluminum (Alq3). If the light-emitting layer 19 is formed of a polymer organic material, a HTL may be included besides the light-emitting layer 119. The HTL may be formed of poly-(2,4)-ethylene-dihydroxy thiophene (PEDOT) or polyaniline (PANI). The organic material may be a poly-organic material, such as polyphenylene vinylene (PPV), and polyfluorene.

The facing electrode 20 is formed on the light-emitting layer 19 as a common electrode. In the organic light-emitting display apparatus 1, the pixel electrode 111 is used as an anode and the facing electrode 20 is used as a cathode. However, the present invention is not limited thereto, and the polarities of the pixel electrode 111 and the facing electrode 20 may be reversed.

The facing electrode 20 may be formed as a reflective electrode that includes a reflective material. The facing electrode 20 may include Al, Mg, Li, Ca, LiF/Ca, or LiF/Al, or any combination thereof. Light generated by the light-emitting layer 19 may be reflected by the facing electrode 20 towards the substrate 10. If the pixel electrode 111 includes the semi-transparent metal layer 111b, the semi-transparent metal layer 111b may function as a semi-transparent minor, and may form a resonance structure together with the facing electrode 20, thereby increasing the optical extraction efficiency of the organic light-emitting display apparatus 1.

In the thin-film transistor TFT region, a first gate electrode layer 211, a second gate electrode layer 212, and the third gate electrode layer 213 are sequentially formed on the substrate 10. The first gate electrode layer 211 is formed from the same layer of material as the pixel electrode 111. When the pixel electrode 111 is formed as a multiple layer structure, the first gate electrode layer 211 may also be formed as a multiple layer structure.

The second gate electrode layer 212 is formed from the same layer of material as the first protection layer 112. That is, the second gate electrode layer 212 may include an oxide that includes crystalline silicon or amorphous silicon that is highly doped with a dopant such as, Zn, Ga, Hf, In, and Sn.

The third gate electrode layer 213 may be formed from the same layer of material as the metal layer 113. Although not shown, the third gate electrode layer 213 may be used as a gate wire.

An active layer 215 of the TFT may be formed on the first insulating layer 14, facing the third gate electrode layer 213. The active layer 215 includes a conductive oxide semiconductor and may be transparent. The conductive oxide semiconductor may include Zn, Ga, Hf, In, and/or Sn. For example, the conductive oxide semiconductor may include InGaZnO, ZnSnO, InZnO, InGaO, ZnO, TiO, and/or hafnium-indium-zinc oxide (HIZO).

As described above, the oxide semiconductor TFT provides excellent device characteristics and can be processed at a low temperature. Furthermore, because the oxide semiconductor TFT may have transparent characteristics in a visible light region and is flexible, the oxide semiconductor TFT may be applied to a transparent display apparatus or a flexible display apparatus.

The second insulating layer 16 is formed so as to cover the active layer 215. Source and drain electrodes 217a and 217b are formed on the second insulating layer 16 and are connected to the active layer 215, through openings C1 formed in the second insulating layer 16. In the pixel region PXL, the drain electrode 217a is connected to the upper surface of the pixel electrode 111 through an opening C2 formed in the first and second insulating layers 14 and 16.

The first protection layer 112 and the metal layer 113 may be sequentially stacked on the pixel electrode 111 and disposed in the opening C2. The drain electrode 217b may be connected to the pixel electrode 111, by directly contacting the metal layer 113 through the opening C2.

In the capacitor region CAP, a first lower electrode layer 311, a second lower electrode layer 312, and a third lower electrode layer 313 are sequentially formed on the substrate 10. The first lower electrode layer 311 is formed from the same layer of material as the pixel electrode 111 and the first gate electrode layer 211. The second lower electrode layer 312 is formed from the same layer of material as the first protection layer 112 and the second gate electrode layer 212. The third lower electrode layer 313 is formed from the same layer of material as the metal layer 113 and the third gate electrode layer 213.

That is, the first, second, and third lower electrode layers 311, 312, and 313 are respectively formed by the same mask processes used to form the pixel electrodes 111 and 112, the metal layer 113, and the first, second, and third electrode layers 211, 212, and 213. Therefore, the manufacturing processes are simplified.

The first and second insulating layers 14 and 16, which function as dielectric layers, are formed on the third lower electrode layer 313. A capacitor upper electrode 317 is formed on the second insulating layer 16. The capacitor upper electrode 317 is formed from the same layer of material as the source and drain electrodes 217a and 217b. The capacitor upper electrode 317 is formed during the same mask process as the source and drain electrodes 217a and 217b. Thus, the manufacturing process may be simplified.

The third insulating layer 18 is formed so as to cover the source and drain electrodes 217a and 217b and the capacitor upper electrode 317. As described above, an opening C4 that exposes the pixel electrode 111 is formed in the third insulating layer 18.

Figure 2:
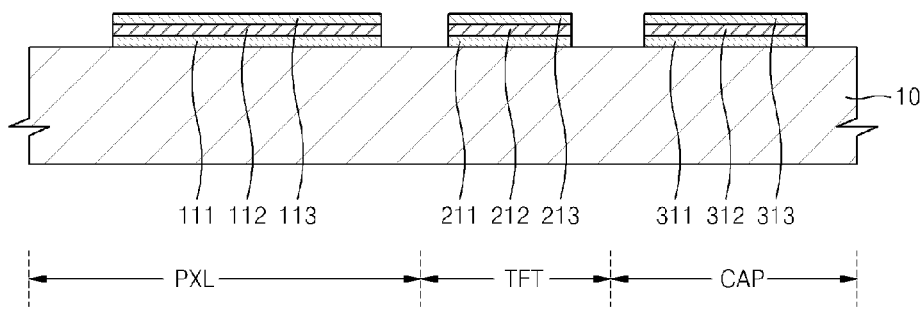
FIG. 2 is a schematic cross-sectional view of a product of a first mask process, according to an exemplary embodiment of the present invention.

Hereinafter, a method of manufacturing the organic light-emitting display apparatus 1, according to an exemplary embodiment of the present invention, will now be described with reference to FIGS. 2 through 8. FIG. 2 is a schematic cross-sectional view of a product of a first mask process of the method of manufacturing the organic light-emitting display apparatus 1, according to an exemplary embodiment of the present invention.

Referring to FIG. 2, the pixel electrode 111, the first protection layer 112, and the metal layer 113 are formed in the pixel region PXL, the first gate electrode layer 211, the second gate electrode layer 212, and the third gate electrode layer 213 are formed in the thin-film transistor region TFT, and the first lower electrode layer 311, the second lower electrode layer 312, and the third lower electrode layer 313 are formed in the capacitor region CAP, using the same mask process. A buffer layer (not shown) that includes $SiO_2$ and/or $SiN_x$ may further be formed on the substrate, to planarize the substrate 10 and to block penetration of foreign elements into the substrate 10.

Although not depicted in detail, the structure of FIG. 2 is formed after sequentially depositing a transparent conductive material, a semiconductor material, and a metal on the substrate 10. A photoresist (not shown) is coated on the on the resultant product. Then a first mask process is performed using the photoresist as a mask, to form the structure of FIG. 2. The first mask process may be a photolithography process. The first mask process may include a series of processes, such as developing, etching, and stripping or ashing, after exposing the first mask (not shown) using an exposure apparatus (not shown).

As depicted in FIG. 1, when the pixel electrode 111 further includes the semi-transparent metal layer 111b, the semi-transparent layers 111a and 111c may further be included on and under the semi-transparent metal layer 111b. The first gate electrode layer 211 and the first lower electrode layer 311 may also be formed as multiple layer structures.

Figure 3:
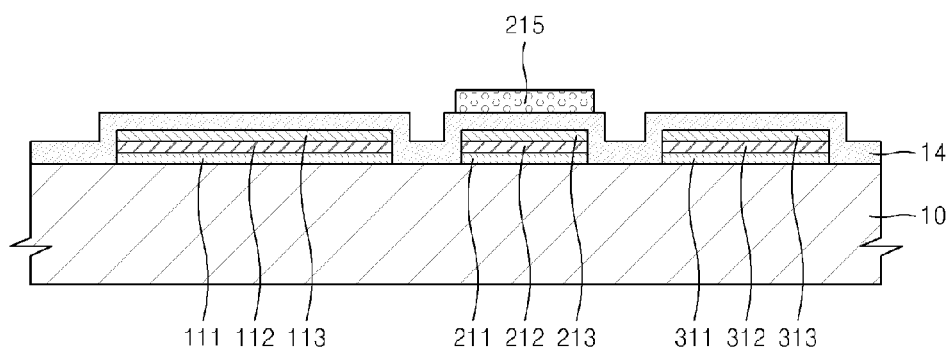
FIG. 3 is a schematic cross-sectional view of a product of a second mask process, according to an exemplary embodiment of the present invention.

FIG. 3 is a schematic cross-sectional view of a product of a second mask process of the method of forming the organic light-emitting display apparatus 1, according to an exemplary embodiment of the present invention. The first insulating layer 14 is formed on the structure of FIG. 2. The active layer 215 is formed on the first insulating layer 14. The active layer 215 includes a transparent conductive oxide.

Figure 4:
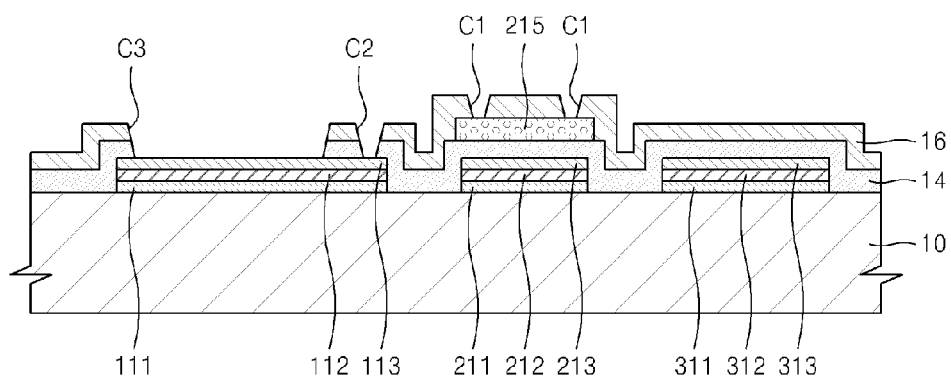
FIG. 4 is a schematic cross-sectional view of a product of a third mask process, apparatus according to an exemplary embodiment of the present invention.

FIG. 4 is a schematic cross-sectional view of a product of a third mask process of the method of forming the organic light-emitting display apparatus 1, according to an exemplary embodiment of the present invention. The second insulating layer 16 is formed on the product of the second mask process. Openings Clare formed in the second insulating layer 16 to expose portions of the active layer 215. Openings C2 and C3 that expose portions of the upper surface of the metal layer 113 are formed in the first and second insulating layers 14 and 16. At this point, the first protection layer 112 and the metal layer 113 remain on the pixel electrode 111. Thus, the first protection layer 112 and the metal layer 113 protect the pixel electrode 111 during the formation of the openings C1, C2, and C3.

Figure 5:
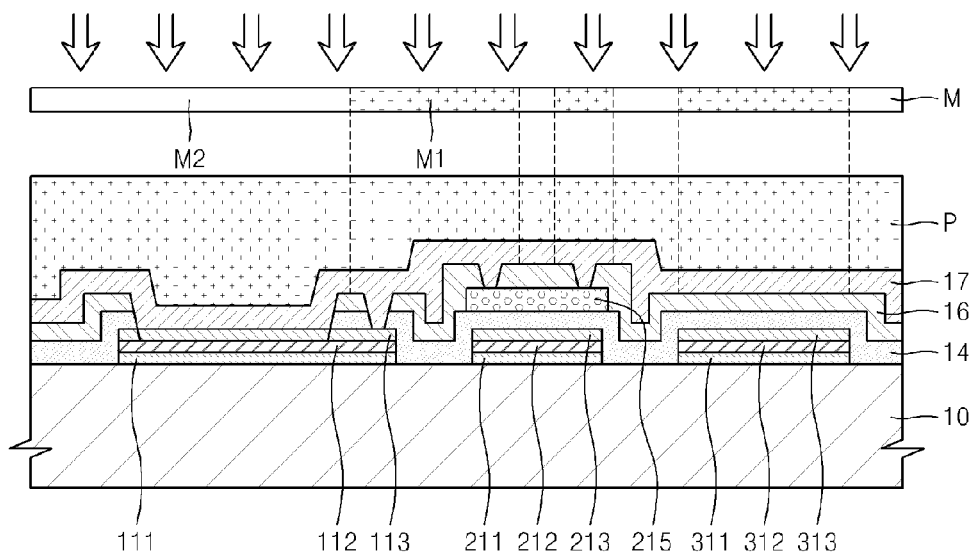
FIG. 5 is a schematic cross-sectional view of a product of a fourth mask process, according to an exemplary embodiment of the present invention.

FIG. 5 is a schematic cross-sectional view of a product of a fourth mask process of the method of forming the organic light-emitting display apparatus 1, according to an exemplary embodiment of the present invention. An electrode material layer 17 that covers the openings C1, C2, and C3 and includes a material for forming the source and drain electrodes 217a and 217b is deposited on the product of the third mask process. A photoresist P is then formed thereon. A photolithography process is performed using a fourth photomask M having a light-blocking portion M1 and a light-transmitting portion M2.

When the photoresist is a positive type photoresist, the portion of the layer 17 corresponding to the light-transmitting portion M2 is removed. The source and drain electrodes 217a and 217b and the capacitor upper electrode 317 are formed on a region corresponding to the light-blocking portion M1.

Figure 6:
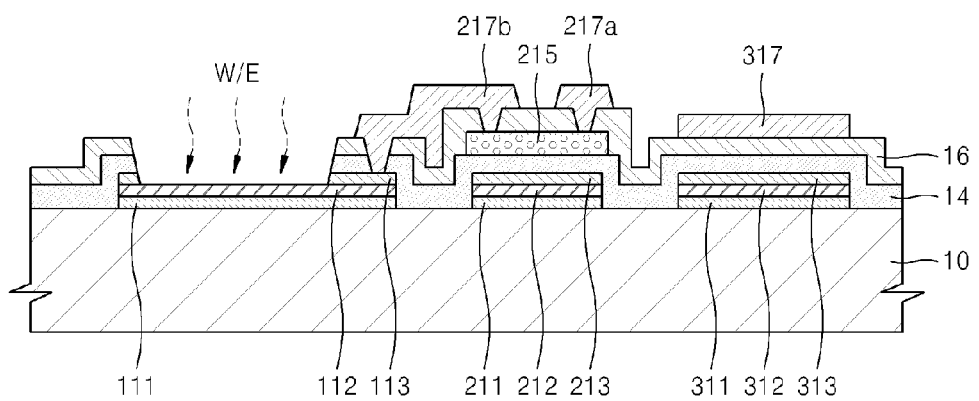
FIG. 6 is a schematic cross-sectional view of a product of a wet etching process in the fourth mask process, apparatus according to an exemplary embodiment of the present invention.

FIG. 6 is a schematic cross-sectional view of a product of a wet etching process W/E of the fourth mask process, according to an exemplary embodiment of the present invention. When portion of the layer 17 corresponding to the light-transmitting portion M2 is removed, a portion of the metal layer 113 on the first protection layer 112 may also be removed when the source and drain electrodes 217a and 217b are formed. In particular, portions of the metal layer 113 and the layer 17 may be readily removed by a wet etching process. At this point, the first protection layer 112 is not removed during the wet etching process W/E. Thus, the pixel electrode 111 is protected.

Figure 7:
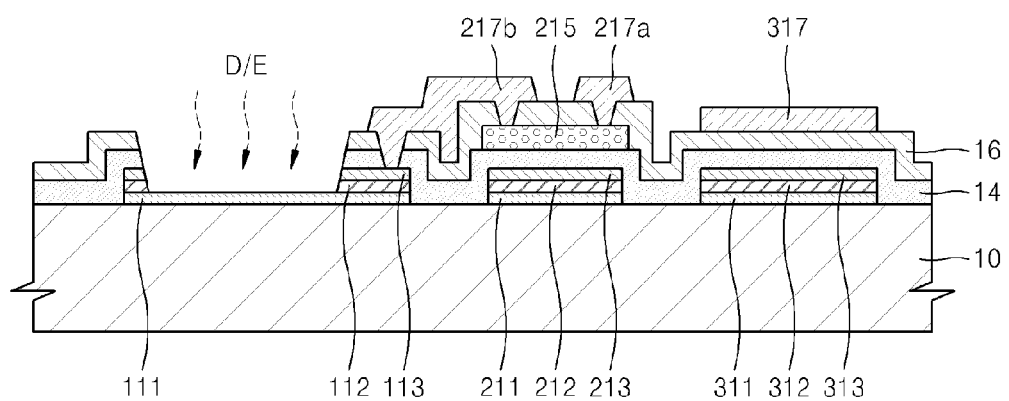
FIG. 7 is a schematic cross-sectional view of a product of a dry etching process in the fourth mask process, according to an exemplary embodiment of the present invention.

FIG. 7 is a schematic cross-sectional view of a product of a dry etching process in the fourth mask process, according to an exemplary embodiment of the present invention. A portion of the first protection layer 112 is removed, for example, by a dry etching process D/E. When the pixel electrode 111 includes a transparent conductive oxide, the pixel electrode 111 may be damaged while the wet etching process W/E is performed. However, because the first protection layer 112 is removed after the wet etching process W/E is performed, the first protection layer 112 may protect the pixel electrode 111.

When the pixel electrode 111 is formed as a multiple layer structure, during the wet etching process W/E, the first protection layer 112 prevents the semi-transparent metal layer 111b from being damaged through pin holes formed in the semi-transparent metal layer 111c. Accordingly, damage to the semi-transparent metal layer 111b is prevented, thereby preventing a reduction of optical efficiency of a display apparatus.

Figure 8:
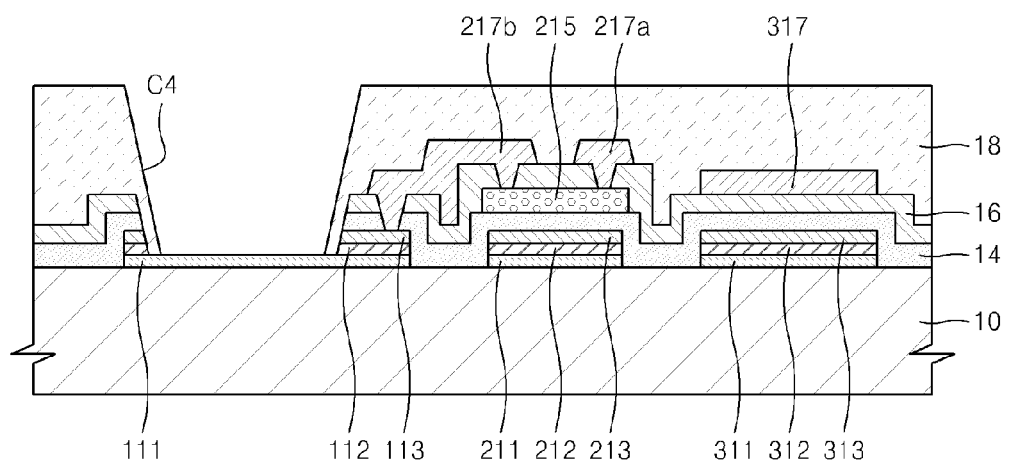
FIG. 8 is a schematic cross-sectional view of a product of a fifth mask process, according to an exemplary embodiment of the present invention.

FIG. 8 is a schematic cross-sectional view of a product of a fifth mask process of the method of forming the organic light-emitting display apparatus 1, according to an exemplary embodiment of the present invention. The third insulating layer 18 is formed on the product of the fourth mask process. An opening C4 that exposes an upper surface of the pixel electrode 111 is formed by removing a portion of the third insulating layer 18.

A back panel that includes a bottom gate type oxide semiconductor, according to an exemplary embodiment of the present invention, can be manufactured by a total of five mask processes. Therefore, manufacturing costs can be greatly reduced.

The present invention is described with reference to an organic light-emitting display apparatus; however, the present invention is not limited thereto. For example, the present invention may also be applied to a liquid crystal display apparatus. Also, the present invention may be applied to various other types of display apparatuses.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a back panel for a display apparatus, the method comprising:
    forming a first electrode material layer on a substrate, the first electrode material layer comprising a transparent conductive layer, a semiconductor layer, and a metal layer;
    performing a first mask process on the first electrode material layer, to form a pixel electrode and a gate electrode;
    forming a first insulating layer on the substrate and a transparent conductive oxide material layer on the first insulating layer;
    performing a second mask process on the transparent conductive oxide layer, to form an active layer on the gate electrode;
    forming a second insulating layer on the substrate;
    performing a third mask process to form first openings in the second insulating layer that expose portions of the active layer, and to form a second opening and a third opening in the first and second insulating layers, the second and third openings exposing portions of the pixel electrode;
    forming a second electrode material layer on the substrate;
    performing a fourth mask process on the second electrode material layer, to form first and second electrodes that contact the active layer through the first openings, and to enlarge the third opening by removing a portion of the metal layer and a portion of the semiconductor layer;
    forming a third insulating layer on the substrate; and
    performing a fifth mask process to remove a portion of the third insulating layer from the third opening and to expose the transparent conductive layer of the pixel electrode.

2. The method of claim 1, wherein the fourth mask process comprises:
    a first process to remove the portion of the metal layer; and
    a second process to remove the portion of the semiconductor layer.

3. The method of claim 2, wherein the first process is a wet etching process, and the second process is a dry etching process.

4. The method of claim 1, wherein the pixel electrode further comprises a semi-transparent metal layer disposed on the transparent conductive layer.

5. The method of claim 1, wherein the first mask process further comprises forming a capacitor lower electrode from the first electrode material layer.

6. The method of claim 5, wherein the fourth mask process further comprises forming a capacitor upper electrode from the second electrode material layer.

* * * * *